United States Patent [19]
Manecci et al.

[11] Patent Number: 4,650,971
[45] Date of Patent: Mar. 17, 1987

[54] ENERGIZATION INDICATOR AND METHOD FOR HEAT TRACE CABLE AND THE LIKE

[75] Inventors: John V. Manecci; Jerry D. Pajer, both of Lorain, Ohio

[73] Assignee: PGM, Inc., Lyndhurst, Ohio

[21] Appl. No.: 544,600

[22] Filed: Oct. 24, 1983

[51] Int. Cl.$^4$ .............................................. H05B 1/02
[52] U.S. Cl. ................... 219/506; 219/549; 219/414; 219/301; 340/642; 340/650; 340/652
[58] Field of Search ............... 219/300, 301, 506, 494, 219/508–510, 528, 549; 340/640, 642, 655, 650, 652

[56] References Cited

U.S. PATENT DOCUMENTS

| | | | |
|---|---|---|---|
| 839,690 | 12/1906 | Zapf | 340/650 |
| 2,287,109 | 6/1942 | Kollath | 240/54 |
| 2,609,432 | 9/1952 | Steen | 340/650 |
| 2,611,008 | 9/1952 | Wilcock et al. | 340/650 |
| 3,069,538 | 12/1962 | Hobson | 240/50 |
| 3,116,480 | 12/1963 | Fernquist | 340/381 |
| 3,321,730 | 5/1967 | Schlangen | 339/12 |
| 3,686,531 | 8/1972 | Decker et al. | 340/650 |
| 3,727,123 | 4/1973 | Smith | 340/650 |
| 3,851,149 | 11/1974 | Daley | 219/528 |
| 4,066,870 | 1/1978 | Colten | 219/528 |
| 4,110,683 | 8/1978 | Cason et al. | 340/650 |
| 4,170,004 | 10/1979 | Portinaro | 340/514 |
| 4,314,140 | 2/1982 | Hughes | 219/300 |

Primary Examiner—M. H. Paschall
Attorney, Agent, or Firm—Renner, Otto, Boisselle & Lyon

[57] ABSTRACT

An optical indicator apparatus includes an optical output device for producing a light output in response to an electrical input thereto, a hollow housing for supporting the optical output device relative to another device to permit viewing of light output by the optical output device, electrical input leads extending through at least a portion of the housing for receiving such electrical input and coupling the same to cause the optical output device to produce an output indicating receipt of such electrical input, and seal material for sealing in substantially fluid-tight relation in the hollow housing at least part of the optical output device and at least part of the electrical input leads while holding the same in relatively fixed position in the hollow housing. A method of identifying the energized condition of an electrical device, such as heat trace cable or the like, includes mounting a plurality of indicators with respect to such heat trace cable or the like at a plurality of locations along the length thereof and electrically connecting such indicators thereto for energization in response to power received at such connection thereof, whereby failure of energization of such an indicator represents a failure in the energization of such heat trace cable or the like.

6 Claims, 6 Drawing Figures

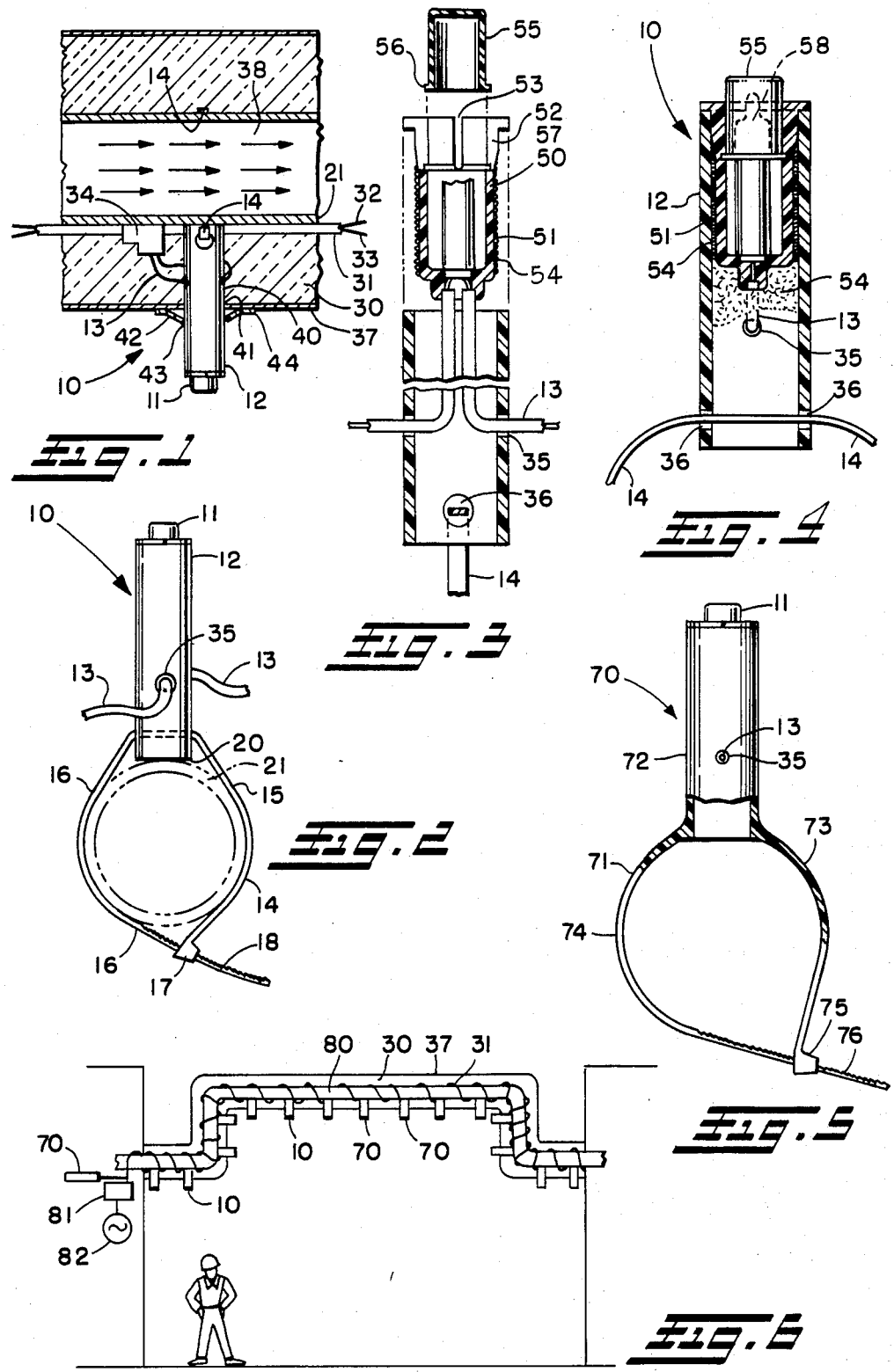

ENERGIZATION INDICATOR AND METHOD FOR HEAT TRACE CABLE AND THE LIKE

DISCLOSURE

This invention relates generally, as indicated, to indicator devices and, more particularly, to indicators for providing indications of proper energization of other devices, such as electrical devices, for example heat trace cable, and identifying possible problem areas therein. The invention also relates to a method for identifying proper energization of such devices, e.g. heat trace cable, and for efficiently and with facility identifying a fault zone in such cable.

BACKGROUND

To avoid the problem of pipes and/or material intended to flow therein freezing or such material becoming undesirably viscous in cold temperatures, heat trace cable has been used to warm the pipes and the material therein. An exemplary heat trace cable is comprised, inter alia, of a pair of conductors that extend in parallel along the length of the cable, heat producing electrical resistance material between the conductors, and an electrical insulation material covering the conductors and the resistance material. Typically at one end of such heat trace cable the conductors are connected to a source of electrical power, such as available line power of, say, 120 volts, 60 Hz. In response to energization by such an electrical source the heat trace cable produces a heat output that may be used to warm a pipe along which it is placed or about which it is wrapped, for example. Heat trace material also may be used to warm large holding or storage tanks. Preferably the heat trace cable is in direct engagement with the external surface of the pipe or tank for maximum thermal transfer efficiency with respect thereto. Moreover, thermal insulation usually over the pipe or tank and heat trace cable helps to retain the heat developed by the cable and to exclude external cold from the pipe and material flowing therein. A further weather resistant layer of protective material also may protect the thermal insulation and the underlying pipe and heat trace cable from moisture, e.g. rain or snow, and from other harsh or caustic chemicals or other pollutants in the local environment.

A problem that may be encountered when heat trace cable is used as above, for example, is that a failure may occur in the heat trace cable whereby a length thereof may be deenergized or otherwise damaged so as not to produce the needed heating of the pipe and material therein. As a result of such lack of heat the pipe may become damaged and leak, and other problems also may occur, for example to the immediate fluid system or to apparatus upstream or downstream of the unheated area, to the fluid itself, etc.

Often such heat trace cable protected pipelines are one hundred feet or even several hundred feet in length, and they may be mounted high above ground for safety, clearance and/or other reasons. Fluid leaking from such a damaged pipe may travel along the insulation material and external protective layer of material before becoming visible to a service or maintenance person and, therefore, may not be a good indicator of the actual location of the damaged part of the pipeline. Accordingly, to locate such damaged portion may be a very difficult and time consuming task, for example requiring the service or maintenance person working in a relatively precarious location to remove a substantial length of protective and insulation material to find the damage.

In the past to help prevent such damage to such pipes or pipelines (pipe and pipeline being used interchangeably herein and generically to represent devices with which heat trace or like material would be used), beginning and ending indicator assemblies have been connected to the heat trace cable at the power input end and at the opposite end thereof to indicate that power was being input to heat trace cable and that power was reaching the opposite end of the heat trace cable remote from the power input end thereof, respectively. If either such indicator assembly were not showing light, an effort could be made to stop the pipe flow before damage occurred. Such prior indicator assemblies required heavy metal boxes to withstand the harsh environments, such as water and other severe weather conditions, harsh chemical pollutants, etc., and to protect the actual indicators themselves, such as electric lamps. Also, such indicator assemblies are relatively expensive to purchase and because of the size and weight thereof are rather difficult to install; usually they would have to be installed in a certain upright condition to assure watertight condition thereof. Additionally, such indicator assemblies have been difficult to service due to frequently encountered damage to the boxes thereof from the harsh environment in which they are located and possibly also due to the relatively inaccessible locations thereof.

Furthermore, if the remote end indicator assembly were not showing light when the beginning indicator was showing light (indicating power input to the heat trace cable but failure of power to reach the remote end of the cable), there was no way to determine the location of the actual failure without inspecting the length of the pipeline until such failure location were found. The time and cost to make such an inspection, including removal of substantial lengths of insulation and weatherproofing material, as well as the potential hazzard involved, especially when the maintenance person is working high above ground, can be substantial.

SUMMARY OF THE INVENTION

The present invention is directed to an indicator of relatively substantial longevity and durability that may be installed with facility in any orientation to indicate the proper energization of heat trace cable or other electrical device. The indicator of the invention also is relatively inexpensive, and this factor together with other features of the invention encourage installation of a plurality of such indicators at relatively close intervals, say every ten or twenty feet, along the pipeline. Such close interval spacing will facilitate locating a failure in a heat trace cable or other device. Other advantages that inure to the invention include the ability to secure the indicator in any particular position relative to a pipe or other device and to facilitate maintaining the thermal and weather tight integrity of the pipe at such indicator installations.

According to one aspect of the invention, then, an optical indicator apparatus includes an optical output device for producing a light output in response to an electrical input thereto, a hollow housing for supporting the optical output device relative to another device to permit viewing of light output by the optical output device, electrical input leads extending through at least a portion of the housing for receiving such electrical input and coupling the same to cause the optical output device to produce an output indicating receipt of such electrical input, and seal material for sealing in substantially fluid-tight relation in the hollow housing at least part of the optical output device and at least part of the electrical input leads while holding the same in relatively fixed position in the hollow housing.

According to another aspect, the invention relates to a support housing for supporting an indicator relative to another device, including a tubular housing member having a first end at which such indicator is exposed for delivering a discernible output and an opposite end for mounting with respect to such device, a passage through at least part of the housing member for passing therethrough input leads for such indicator, and a securing device integrally formed as part of the housing member for securing the housing member with respect to such device.

According to still another aspect of the invention, a method of identifying the energized condition of an electrical device, such as heat trace cable or the like, includes mounting a plurality of indicators with respect to such heat trace cable or the like at a plurality of locations along the length thereof and electrically connecting such indicators thereto for energfization in response to power received at such connection thereof, whereby failure of energization of such an indicator represents a failure in the energization of such heat trace cable or the like.

These are only exemplary advantages and features of the invention, and others will become more apparent as the following description proceeds.

To the accomplishment of the foregoing and related ends the invention, then, comprises the features hereinafter fully described and particularly pointed out in the claims, the following description and the annexed drawing setting forth in detail certain illustrative embodiments of the invention, these being indicative, however, of but several of the various ways in which the principles of the invention may be employed.

BRIEF DESCRIPTION OF THE DRAWINGS

In said annexed drawing:

FIG. 1 is a partial schematic view, partly broken away in section, of an indicator according to the present invention mounted with respect to a pipeline and electrically connected to heat trace cable;

FIG. 2 is an upright side elevation of the indicator of FIG. 1;

FIG. 3 is an enlarged exploded side elevation view, partly broken away in section, of the indicator;

FIG. 4 is an enlarged side elevation view, partly broken away in section, of the indicator assembled and ready for mechanical and electrical connection as in FIG. 1, for example;

FIG. 5 is a section view of an indicator according to the preferred embodiment and best mode of the invention having integral securing straps; and FIG. 6 is a schematic illustration of a plurality of indicators according to the invention used to identify the energization of heat trace cable along the length of a pipeline.

DETAILED DESCRIPTION

Referring now in detail to the drawing, wherein like reference numerals designate like parts in the several figures, and initially to FIGS. 1 and 2, an indicator in accordance with the present invention is designated 10. The indicator 10 includes an optical output device, such as a neon lamp 11, a support housing 12, a pair of electrical leads 13 for providing an electrical input to the lamp 11, and a mounting device 14, which may be a conventional tie wrap. The indicator 10 preferably is mountable directly onto a pipe using the tie wrap 14 to hold the indicator securely to the pipe. Accordingly, preferably the tie wrap has a pair of straps 15, 16 and a lock 17 at the end of the strap 15. (The straps 15, 16 may be respective portions of a continuous strap.) The lock 17 may be of conventional design, whereby the end 18 of the strap 16 may be inserted through the lock 17 and pulled tight, whereupon the lock 17 secures the straps 16 and 18 therein generally tending to prevent withdrawing of the end 18. The mounting end 20 of the indicator housing 12 may be generally planar or contoured to fit closely in engagement with the exterior surface of the pipe 21 especially when the tie wrap 14 is tightened securely about the pipe 21. Accordingly, the housing 12 will extend generally radially with respect to a cylindrical pipe, for example.

In the preferred embodiment the output device 11 is a neon lamp. However, it will be appreciated that other types of output devices for providing a discernible signal or information may be used. For example, light emitting diodes, other optical output devices, and even other output devices that produce output information other than of the optical type also are contemplated for use in accordance with the present invention.

According to the present invention a tie wrap is the preferred device for securing the indicator 10 to a pipe 21 or the like. Such tie wraps are easy to use, hold securely substantially indefinitely, and are relatively inexpensive. Moreover, such tie wraps are of relatively thin or low profile material so that they will not interfere with thermal insulation 30 and heat trace cable 31 circumscribing and/or extending along the pipe 20. Another advantage to a tie wrap securing device is the facility with which it can be included as part of the indicator 10 and the facility with which it can be used to secure the indicator 10 to a pipe 21 or the like, especially in relatively precarious places, for example at high levels above the ground. If desired, though, other means may be employed to secure the indicator 10 to a pipe 21 or to another device.

The indicator 10 is intended to provide a prescribed output in response to receipt of a prescribed input. According to the preferred embodiment and best mode of the invention, such output is an optical one and such input is an electrical one. For that reason the leads 13 preferably are electrically connected to a device, the energization of which is to be monitored and/or indicated by the indicator 10. An example of a use of the indicator 10 is a connection thereof in the circuit of conventional heat trace cable 31. Another example of a use of the indicator 10 would be to indicate the flow of power through power lines of another device or to another device, a specific example being an electric freezer where it is desired to indicate whether or not power is flowing to the freezer without opening the freezer compartment. Likewise, the indicator may be employed with heating apparatus to identify energization thereof. Other type of input device also may be employed such as, for example, temperature sensitive input device, light sensitive input device, etc.

As is seen in FIG. 1, according to the preferred embodiment and best mode of the invention, the indicator 10 is secured to the pipe 21 using the tie wrap 14. The indicator 10 is pointing in a downward direction for visibility by an observer located beneath the pipe 21 because such pipes often are located overhead. Preferably prior to such securing of the indicator 10 to the pipe 21, the leads 13 are electrically connected to the respective parallel electrical conductors 32, 33 in the heat trace cable 31. A conventional butt joint connector may be used for this purpose, as is shown schematically at 34 in FIG. 1. In such a butt connector arrangement, the electrical integrity of the respective conductors is maintained via such joint and the leads 13 are connected to such respective conductors. Preferably the exposed conductors and connections at the butt joint 34 are well sealed in material that prevents water and other materials that could damage the conductors or the connections thereof from reaching the same; and in the preferred embodiment of the invention the butt joint connection 34 initially is taped with conventional electrical friction tape and thereafter a further tape material known as Posiseal material sold by General Electric Company is used to maintain such waterproof integrity of the connection.

The electrical leads 13 are allowed to pass from the lamp 11 through the cylindrical side wall of the housing 12 at a location displaced away from the end 20 so that such end may rest firmly against the pipe 21 for strength of positioning and to avoid applying force to the leads that could damage the same. The tie wrap 14 similarly is passed through another set of openings 36 through the wall of the housing 12.

To complete an installation on a pipe 21, according to the invention, after the indicator 10 has been electrically connected to the cable 31 and mechanically connected by the tie wrap 14 to the pipe 21, a hole would be formed in the insulation 30 to accommodate the indicator 10; the insulation 30 is applied around the pipe 21 leaving a portion of the indicator 10 exposed, as is seen in FIG. 1; an opening also is formed in the waterproofing or weatherproofing material 37, such as tarpaper, roofing material, metal sheet material, or the like, to accommodate the indicator 10; and such material 37 is placed in protective position over the insulation 30, as is seen in FIG. 1.

Accordingly, in response to an electrical input to the conductors 32, 33 of the cable 31, such cable produces a heat output which warms the pipe 21 and the fluidic material 38 therein. The insulation layer 30 retains that heat and blocks cold from the pipe, and the waterproofing layer 37 maintains the waterproof and otherwise protected environment for the insulation 30, for the joint 34, and, if necessary, for the cable 31 and pipe 21. It is preferred that the openings 40, 41, respectively through the insulation 30 and protective layer 37 are slightly smaller than the external dimension, for example diameter, of the indicator housing 12 so that there is a relatively close fit therebetween to maintain both thermal and weatherproof integrity provided by the insulation 30 and protective material 37. However, if desired, a sealing washer 42 of waterproof and somewhat flexible material may be placed over the indicator housing 12 further to protect the fluid-tight and thermal-tight integrity of the cooperative portions of the housing 12 and opening 41. Such washer 42 may have a central opening 43 of a diameter slightly smaller than the external diameter of the housing 12 to engage the same securely and an edge 44 that closely engages the exposed surface of the material 37.

It will be appreciated that the indicator 10 according to the invention may be used to provide a light output when electrical power is provided thereto at the joint 34. Accordingly, such a light output indicates, for example, that electrical power is provided to the heat trace cable 31 from the power source up to such joint. The indicator 10 also may be used to indicate proper energization and/or delivery of electrical power to any other device to which it is electrically connected.

Preferably the tie wrap 14 holds the indicator 10 in relatively secure position with respect to the pipe 21 or other device to which the indicator is mounted. The insulation 30 and protective layer of material 37 further assist in securely holding the indicator 10 in relatively fixed position. Other means also may be used for such securing and mounting purposes. For example, if the indicator 10 were used on a large tank about which heating or other electrical means are positioned to heat material in the tank, other means may be used to mount and to secure the indicator 10 with respect to such tank. For example, in such an installation the insulation 30 and material 37 may be employed to hold the indicator in position without using a tie wrap; additional means may be employed, as well, to secure the indicator with respect to the tank, for example.

Turning, now, to FIGS. 3 and 4, the indicator 10 is illustrated in exploded and assembled views, respectively. The housing 12 preferably is formed of molded or extruded phenolic material. Such material may be hollow tubular in form or may be solid in which case the interior is removed by conventional process. The holes 35 for the leads 13 and 36 for the tie wrap 14 may be drilled or punched through the hollow tubular housing 12 or formed during molding. The leads 13 are inserted through the openings 35 before or during the process of inserting the lamp support 50 into the housing 12.

The lamp support 50 preferably has a cylindrical base 51 and resilient tab-like portions 52 mounted on the base and separated from adjacent tabs by slots 53. The free diameter of the lamp support 50 proximate the tabs 52 is slightly larger than the inner diameter of the housing 12 and outer diameter of the cylindrical base 51. Therefore, upon insertion of the lamp support 50 into the housing 12 the tabs 52 are resiliently deformed radially inwardly while resiliently engaging the inner wall of the housing 12. Moreover, in the preferred embodiment a sealant or potting material 54 is applied to the lamp support 50. Such sealant 54 both provides a watertight seal between the lamp support 50 and the housing 12 to prevent water or other harsh chemicals from entering the housing between the lamp support 50 and housing wall; and the sealant 54 also cures or hardens to perform an adhesive function helping to secure or to hold the lamp support 50 in the housing 12. Such sealant 54 may be, for example, a silicone or silastic potting or sealant compound. Preferred sealant or potting material is silastic material sold by General Electric Company.

After the lamp support 50 and leads 13 are inserted into the housing 12, for example as is shown in FIGS. 3 and 4, the protective cover or cap 55 of the lamp 11 may be inserted into the lamp support 50. Such cover 55 has a locking flange 56 circumferentially about the same, and that flange locks in place in a locking groove 57 about the internal wall of the lamp support 50. Upon such insertion of the cover 55 to the condition shown in FIG. 4, for example, such cover further resiliently deforms the tabs 52 into tight engagement with the inner wall of the housing 12 and also itself securely mates with the lamp support 50 to maintain at least a substantial fluid-tight integrity with the latter and fluid-tight isolated environment for the actual light emitting device 58, in the preferred embodiment a neon bulb.

To maintain the durability and longevity of the indicator 10, such sealant or potting compound material 54 also is inserted into the housing 12 from the mounting end 20. The quantity of such sealant 54 so inserted and placement thereof should be such that the sealant is adequate to seal in watertight and preferably other fluid-tight relation that portion of the lamp 11 which is in the housing 12, including, for example, the cylindrical base 51 and the entrance-way of the leads 13 into the lamp support base 51. Furthermore, to hold the leads 13 in relatively secure position in the housing 12 to minimize the possibility of the same disconnecting from the bulb 58, such sealant or potting material 54 should extend a fair distance in the housing but preferably should allow the leads to be free where they exit the openings 35 for maximum flexibility thereof. Thus, with the cover 55 in position, the lamp support 50 secured in the housing 12 and the potting material 54 sealing the lamp 11 in the housing, secure watertight integrity of the various portions of the lamp is maintained in order to assure maximum longevity thereof.

A lamp 11 used in accordance with the invention may be a "SNAPLITE" 125 volt, ⅓ watt neon bulb manufactured or sold by Leecraft, and such a lamp when protected from harsh environment may have a useful life exceeding 10,000 hours. Such life expectancy is significantly longer than conventional incandescent indicator lamps previously used in the indicator boxes of the prior art. In the present invention the indicator 10 may be positioned in virtually any orientation while the fluid-tight and environment protected condition thereof is maintained.

Turning now to FIG. 5, the preferred embodiment and best mode of the present invention in the form of an indicator 70 is illustrated. The indicator 70 is substantially similar to the indicator 10 described above and illustrated in the drawings at FIGS. 1–4. However, in the indicator 70 the securing or mounting device 71 for securing the indicator housing 72 to the pipe 21, for example, is in the form of a pair of straps 73, 74 which are integrally molded as part of the housing 72. Such straps 73, 74 may be tapered, as shown, for strength of connection at the junction thereof with the main body portion of the housing 12 and are of the type that have a lock 75 at the end of one of those straps to receive an end 76 of the other strap to pass therethrough in the same manner as the straps 15, 16, lock 17, and end 18 of the tie wrap 14 cooperate as was described above with reference to FIG. 4. A particular advantage to the indicator 70 having the securing mechanism 71 integrally molded as part of the housing 72 is that only one single part, namely the indicator 70 itself, need be carried by an installer when installing the same on a pipe. There is no chance of a separate tie wrap 14 being forgotten or falling out from the indicator housing 12 (FIG. 4) prior to installation. This advantage is quite significant especially in those situations that the indicator 70 is used on pipelines or other mechanical or electrical apparatus that are disposed in relatively inaccessible locations, such as the overhead pipeline 80 illustrated in FIG. 6. The indicator housing 72 may be molded using conventional injection molding technique with the straps 73, 74 and lock 75 formed integrally with the housing during a single molding process. The housing 72 preferably would be of phenolic material or other preferably electrically nonconductive material and relatively inert, such as weather resistant, non-corrosive, etc. material.

Briefly referring to FIG. 6, a plurality of indicators 10 or 70 are shown mounted on a pipeline 80 that is located at an overhead position relative to ground level. The indicators 10, 70 are secured to the pipe 80 and are electrically connected to the heat trace cable 31 that is wrapped about the pipe. The heat trace cable itself is connected via a conventional electrical switch 81 to a source of electrical power 82, which may be serviced from the utility company.

A service person shown in FIG. 6 can conveniently inspect each of the indicators to confirm energization of the heat trace cable when all the indicators are illuminated. However, when one of the indicators or a series of them electrically downstream from the power source is unilluminated, the occurrence of a fault clearly is detected. If a series of indicators relatively downstream from the power source are not illuminated, then the service person will know that a failure occurs in the heat trace cable at a location relatively proximate the unilluminated indicator that is most proximate the power source. If only a single indicator is not illuminated, then it is likely that there is a failure in that indicator itself. On seeing a failure indication, the service person promptly is directed to the location of the failure and can effect appropriate repair. The indicator 85 proximate the switch 81 may be used to indicate that power is being delivered to the heat trace cable 31. In like manner such indicators 85 may be used in other environments to indicate energization of an electrical circuit, appliance, or the like.

We claim:

1. A method of identifying the energized condition of heat trace cable or the like, comprising mounting a plurality of visible light output indicators with respect to such device at a plurality of locations therealong intermediate respective power input and relatively remote ends thereof and electrically connecting such indicators to such device for energization in response to power received at such connection thereof, whereby failure of energization of such an indicator represents a failure in the energization of such device.

2. The method of claim 1, such device comprising heat trace cable, said electrically connecting comprising forming a butt joint thereof including leads of the indicator and leads of such heat trace cable.

3. The method of claim 2, further comprising sealing in waterproof relation such electrical connection.

4. The method of claim 1, said mounting comprising using a tie wrap to circumscribe such device to which the indicator is mounted.

5. The method of claim 4, such device comprising heat trace cable positioned with respect to a pipe to heat the latter, said mounting comprising mounting such indicator at spaced locations of from about 5 feet to about 50 feet along the length of such pipe.

6. The method of claim 4, wherein such device comprises heat trace cable positioned with respect to a pipe, insulation and weatherproofing material about at least a portion of such pipe and heat trace cable, and said mounting comprising forming an opening in such insulation and weatherproofing material and locating the indicator therethrough.

* * * * *